United States Patent
Tsai et al.

(10) Patent No.: US 8,506,316 B2
(45) Date of Patent: Aug. 13, 2013

(54) ELECTRICAL CONNECTION DEVICE HAVING A FIXING MEMBER WITH A POSITIONING PORTION ENGAGING A GROOVE IN A SOCKET

(75) Inventors: Shang Ju Tsai, Keelung (TW); Yan Xian Yuan, Guangzhou (CN); Yao Li, Guangzhou (CN)

(73) Assignee: Lotes Co., Ltd., Keelung (TW)

( * ) Notice: Subject to any disclaimer, the term of this patent is extended or adjusted under 35 U.S.C. 154(b) by 21 days.

(21) Appl. No.: 13/442,951

(22) Filed: Apr. 10, 2012

(65) Prior Publication Data

US 2013/0183849 A1    Jul. 18, 2013

(30) Foreign Application Priority Data

Jan. 12, 2012    (CN) .......................... 2012 2 0011418

(51) Int. Cl.
*H01R 13/62*    (2006.01)

(52) U.S. Cl.
USPC .......................................... 439/331

(58) Field of Classification Search
USPC ............................. 439/330, 331, 67, 73, 342
See application file for complete search history.

(56) References Cited

U.S. PATENT DOCUMENTS

| | | | | |
|---|---|---|---|---|
| 6,932,622 B2 * | 8/2005 | Liao et al. | ....................... | 439/73 |
| 6,957,973 B1 * | 10/2005 | McHugh et al. | .............. | 439/331 |
| 7,029,309 B2 * | 4/2006 | Ma | ................ | 439/331 |
| 8,353,708 B2 * | 1/2013 | Hsu | ................ | 439/67 |

* cited by examiner

*Primary Examiner* — Chandrika Prasad
(74) *Attorney, Agent, or Firm* — Morris Manning & Martin LLP; Tim Tingkang Xia, Esq.

(57) ABSTRACT

An electrical connection device for electrically connecting a chip module includes a reinforce device and a socket. The reinforce device includes a load plate, a stiffener, a fixing member and a pressing member. The fixing member is disposed on the load plate and used for fixing the chip module, and at least one positioning portion is disposed on the fixing member. The load plate is pivoted to the stiffener. The pressing member is disposed on the stiffener and used for pressing the load plate to be closed on the stiffener. The socket locates below the chip module, and electrically conduct to the chip module. The socket contacts and is positioned by the positioning portion of the fixing member.

9 Claims, 6 Drawing Sheets

ELECTRICAL CONNECTION DEVICE HAVING A FIXING MEMBER WITH A POSITIONING PORTION ENGAGING A GROOVE IN A SOCKET

CROSS-REFERENCE TO RELATED APPLICATIONS

This non-provisional application claims priority under 35 U.S.C. §119(a) on Patent Application No. 201220011418.9 filed in P.R. China on Jan. 12, 2012, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connection device, and more particularly to an electrical connection device capable of ensuring accurate connection between a chip module and a socket.

BACKGROUND OF THE INVENTION

Currently, an electrical connection device commonly used in the field generally includes: a stiffener, extending upward to form a pivoting portion; a load plate, being a cover body made of a metal material, and covering above the stiffener, in which one end of the load plate is movably connected to the pivoting portion, and the other end of the load plate is capable of freely rotating relative to the pivoting portion, so as to achieve closing and opening of the load plate and the stiffener; a socket, located below the chip module, in which a plurality of conductive terminals are disposed in the socket to contact pins of the chip module so as to transfer signals; a fixing member, fixedly disposed on the load plate, in which the fixing member is used for fixing the chip module, and contact between the chip module and the socket is achieved through rotation of the load plate; and a pressing member, for pressing the load plate to be closed on the stiffener. As the socket has been soldered to the circuit board in advance, during assembly of the chip module, the chip module can be fixedly connected to the socket by simply fixing the chip module to the fixing member, connecting the fixing member to the load plate, closing the load plate and using the pressing member to press the load plate.

Through such an electrical connection device, the chip module is connected to the fixing member, the fixing member is fitted to the load plate, and the load plate is rotated to enable the chip module to contact the socket, so that when the fixing member is mounted to the load plate, the fixing member and the load plate are not fixed in place, or when the load plate is closed on the stiffener, the fixing member slides relative to the load plate, leading to inaccurate alignment between the pin of the chip module and the conductive terminal, thereby affecting the electrical connection function of the electrical connection device.

Therefore, a heretofore unaddressed need exists in the art to address the aforementioned deficiencies and inadequacies.

SUMMARY OF THE INVENTION

In one aspect, the present invention is directed to an electrical connection device capable of accurately connecting a chip module to a socket.

In one embodiment, an electrical connection device for electrically connecting a chip module includes: a reinforce device, including a load plate, a stiffener, a fixing member and a pressing member, in which the fixing member is disposed on the load plate and used for fixing the chip module, at least one positioning portion is disposed on the fixing member, the load plate is pivoted to the stiffener, and the pressing member is disposed on the stiffener and used for pressing the load plate to be closed on the stiffener; and a socket, located below the chip module, and electrically conducted to the chip module, in which the socket contacts and is positioned by the positioning portion.

As compared with the related art, in the present invention, among other things, the positioning portion is disposed on the fixing member to further position the fixing member when the load plate is closed on the stiffener, and the chip module is fixedly connected to the fixing member, so that it may be ensured that the chip module can accurately contact the socket, thereby achieving electrical connection.

Further, the positioning portion is disposed on the fixing member adjacent to an end where the load plate is pivoted to the stiffener. A guide surface is disposed at an edge of the positioning portion to guide the positioning portion to be fastened to the socket. At least one groove is disposed on the socket, the positioning portion has at least one chamfer, and the chamfer extends laterally from the positioning portion and cooperates with the groove for positioning. The fixing member has two positioning portions, and the two positioning portions are disposed symmetrically. At least one restricting slot is disposed on the fixing member, at least one protrusion is disposed on the load plate, and the protrusion and the restricting slot cooperate for fixing. Two first elastic arms are disposed at one end of the restricting slot, and two second elastic arms are disposed at the other end of the restricting slot corresponding to the two first elastic arms, the two first elastic arms are disposed opposite to the two second elastic arms, a minimum space between the two first elastic arms is smaller than a minimum space between the two second elastic arms, the protrusion is located in the two second elastic arms, and the two first elastic arms are used for limiting displacement of the protrusion toward the first elastic arm; at least one sliding slot is disposed on a bottom surface of the fixing member, so that the protrusion slides in the sliding slot. At least one positioning post is disposed on the socket, a positioning slot is disposed on the fixing member corresponding to the positioning post, and the positioning post cooperates with the positioning slot to fix the fixing member and the socket.

In another embodiment, the positioning portion is disposed on the fixing member away from an end where the load plate is pivoted to the stiffener, and when the chip module is about to contact the socket, a bottom surface of the positioning portion is lower than a bottom surface of the fixing member.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
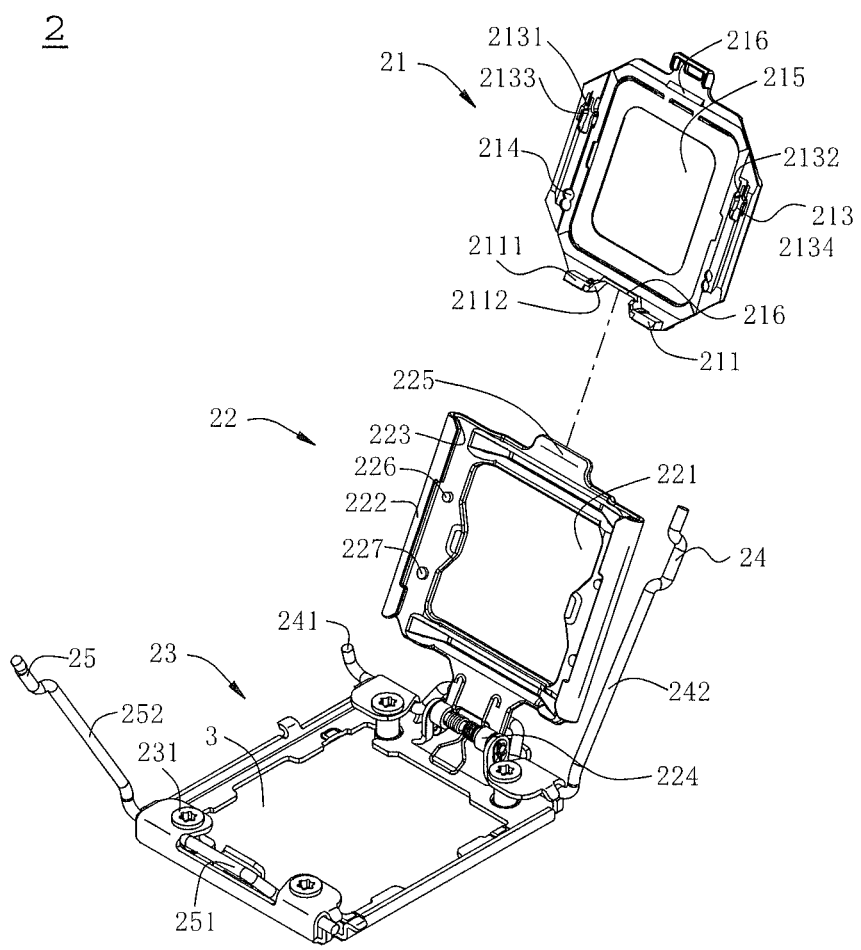
FIG. 1 is a schematic three-dimensional exploded view of a reinforce device in an electrical connection device according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

Figure 2:
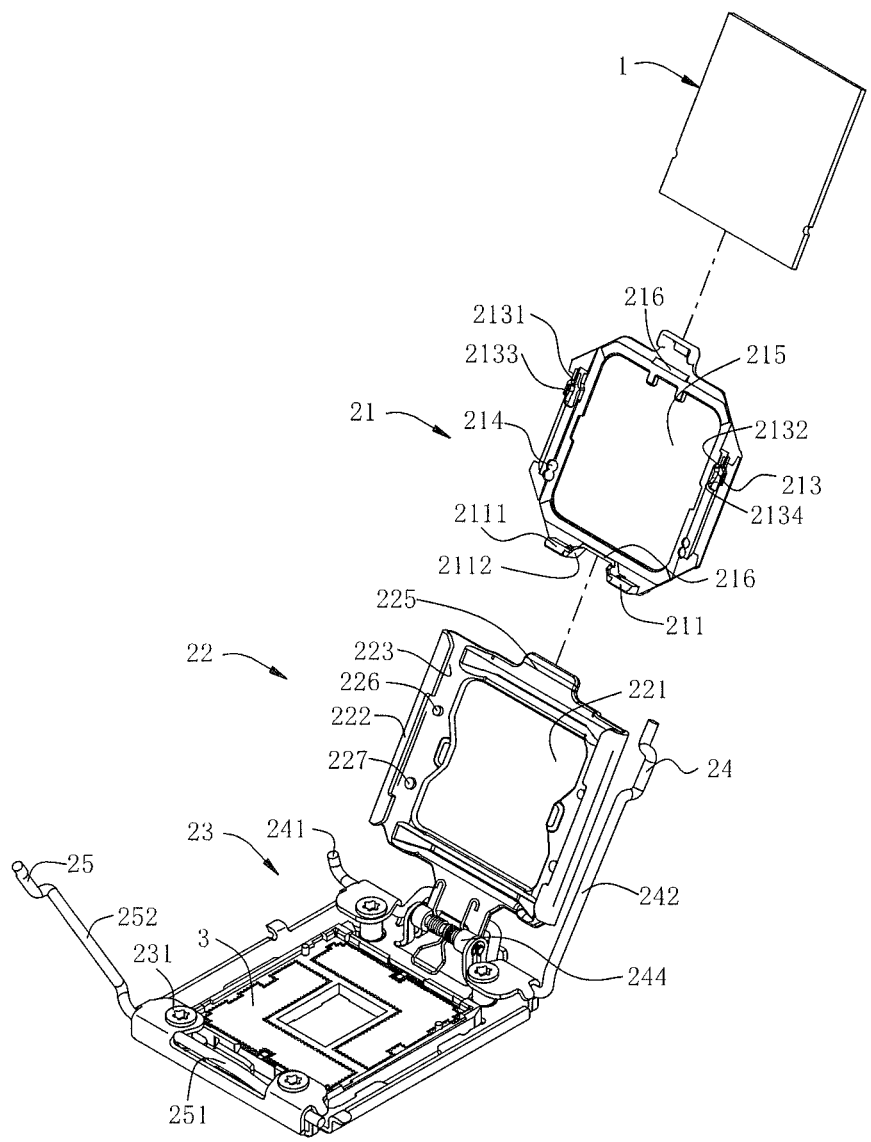
FIG. 2 is a schematic three-dimensional exploded view of a socket in the electrical connection device according to one embodiment of the present invention and a chip module.

Referring to FIG. 1 and FIG. 2, an electrical connection device of the present invention for electrically connecting a chip module 1 includes a reinforce device 2 and a socket 3. The reinforce device 2 includes a stiffener 23, a load plate 22, a fixing member 21 and a pressing member 25. The fixing member 21 is disposed on the load plate 22, the load plate 22 is pivoted to the stiffener 23, the pressing member 25 is used for pressing the load plate 22 to be closed on the stiffener 23, and the socket 3 is located below the chip module 1.

Referring to FIG. 1, the stiffener 23 is fixedly connected to a circuit board (not shown). The stiffener 23 is substantially in the shape of a frame, and is fixed to the circuit board (not shown) through four screws 231. A front end of the stiffener 23 is pivoted to a first lever 24. The first lever 24 includes a first rotating portion 241 pivoted to the front end of the stiffener 23 and a first operating portion 242 perpendicular to the first rotating portion 241. The first operating portion 242 is located on the right side of the stiffener 23, and rotates relative to the first rotating portion 241. A rear end of the stiffener 23 is connected to the pressing member 25. In this embodiment, the pressing member 25 is a second lever having substantially the same structure as the first lever 24, in which the second lever has a second rotating portion 251 pivoted to the rear end of the stiffener 23 and a second operating portion 252 perpendicular to the second rotating portion 251, and is located at the left side of the stiffener 23, and opposite to the first operating portion 242.

The load plate 22 is covering above the stiffener 23. The load plate 22 is made of metal, and has a through hole 221 formed in the middle. Left and right sides of the load plate 22 are bent downward and extend to form a side wall respectively, and the two side walls are bent inward and extend to form a buckling portion 222 respectively. A receiving slot 223 is formed between the buckling portion 222 and the load plate 22. A tail end of the load plate 22 is bent and extends to form a pivoting portion 224, a middle segment of the first rotating portion 241 enters a clearance of the pivoting portion 224, and the pivoting portion 224 is pivoted to the stiffener 23. A front end of the load plate 22 is bent forward and extends to form a pressed portion 225, and after the load plate 22 is closed on the stiffener 23, the second lever is rotated so that the second rotating portion 251 presses the pressed portion 225. The left and right sides of the load plate 22 are respectively disposed with a protrusion 226. The two protrusions 226 are two small cylinders, and are located in the same line. Alternatively, one or more protrusions 226 may also exist, and various positional relationships may exist. In this embodiment, a bump 227 is disposed along a rectilinear direction of the protrusion 226, the diameter of the bump 227 is larger than that of the protrusion 226, the bump 227 is disposed at one side adjacent to the pivoting portion 224, and the protrusion 226 is disposed at one side adjacent to the pressed portion 225.

Figure 5:
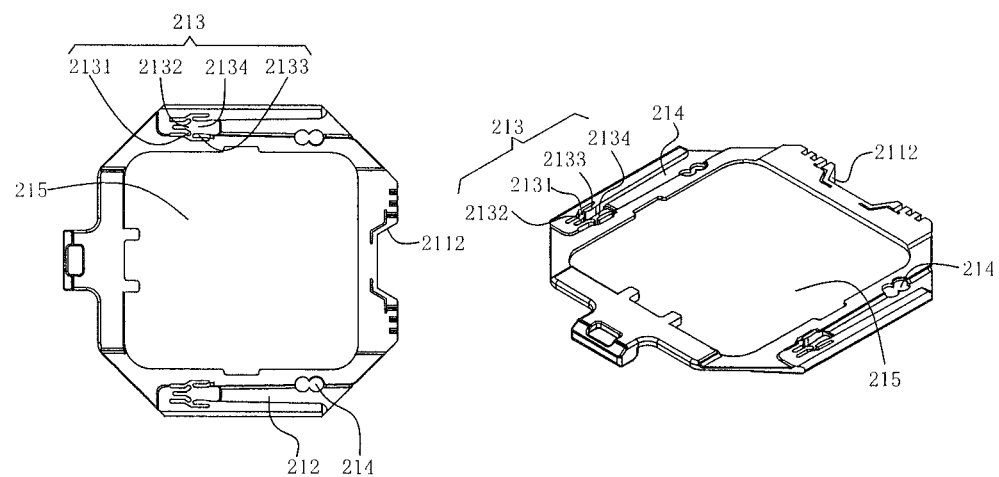
FIG. 5 is a schematic three-dimensional view of a fixing member in the electrical connection device according to one embodiment of the present invention.

Referring to FIG. 1 and FIG. 5, the fixing member 21 is in the shape of a frame of substantially the same size as the load plate 22, and is made of plastic, or alternatively may be made of other materials such as metal. The fixing member 21 is disposed on the load plate 22, and located between the load plate 22 and the stiffener 23. Two positioning portions 211 are disposed on the fixing member 21, the two positioning portions 211 are located on the same side, and are disposed symmetrically along the central line of the side. In other embodiments, the number of the positioning portions 211 may also be one or more. The two positioning portions 211 are disposed on the fixing member 21 adjacent to an end where the load plate 22 is pivoted to the stiffener 23. An edge of each of the two positioning portions 211 is disposed with a guide surface 2111, the two positioning portions 211 have two opposite chamfers 2112, the two chamfers 2112 extend laterally from two adjacent ends of the positioning portions 211, and the two chamfers 2112 are also disposed with the guide surface 2111.

Left and right sides of a bottom surface of the fixing member 21 are respectively recessed with a sliding slot 212, and the sliding slot 212 extends from one side disposed with the positioning portion 211 to the other side, and has a width larger than the diameter of the protrusion 226. During assembly of the fixing member 21, the protrusion 226 and the bump 227 slide in the sliding slot 212, and the bump 227 assists to position the fixing member 21 in a direction perpendicular to the sliding direction.

Left and right sides of the fixing member 21 are respectively disposed with a restricting slot 213, the restricting slot 213 is located at a tail end of the sliding slot 212 away from the positioning portion 211, and as the most preferred embodiment, the restricting slot 213 runs through the fixing member 21. In other embodiments, the restricting slot 213 may also be recessed, and the number of the restricting slot 213 is not limited to two, and may also be one or more. Two first elastic arms 2131 are disposed at one end of the restricting slot 213 away from the end where the load plate 22 is pivoted to the stiffener 23, and tail ends of the two first elastic arms 2131 are bent outward to form a first notch 2132 larger than the space between the two first elastic arms 2131. Alternatively, the first notch 2132 may also be formed by bending the first elastic arms 2131 inward, but the width of the first notch 2132 needs to be smaller than the diameter of the protrusion 226. Two second elastic arms 2133 are disposed at one end adjacent to the end where the load plate 22 is pivoted to the stiffener 23 corresponding to the two first elastic arms 2131, and the two first elastic arms 2131 are disposed opposite to the two second elastic arms 2133. Chamfers are formed at tail ends of the two second elastic arms 2133 to form a second notch 2134 slightly larger than the space between the two second elastic arms 2133. The width of the second notch 2134 not only needs to be larger than that of the first notch 2132, but also needs to be larger than the diameter of the protrusion 226. The protrusion 226 enters the two second elastic arms 2133 first, and is finally located in the second notch 2134 to urge against the first notch 2132, and the two first elastic arms 2131 are used for limiting displacement of the protrusion 226 toward the two first elastic arms 2131.

Two positioning slots 214 are disposed at one side of the fixing member 21 adjacent to the positioning portion 211, the two positioning slots 214 are disposed symmetrically, and in this embodiment, the two positioning slots 214 run through the fixing member 21, and the chip module 1 is disposed with a recessed portion 11 at each position corresponding to the two positioning slots 214.

Moreover, a fixing structure is further disposed to retain the chip module 1. The fixing structure includes an accommodating hole 215 recessed from a surface of the fixing member 21 and used for bearing the chip module 1, and a side wall of the accommodating hole 215 stops an edge of the chip module 1. As the most preferred embodiment, the accommodating hole 215 partially runs through the fixing member 21 corresponding to the through hole 221 of the load plate 22. Two protruding blocks 216 are disposed on the fixing member 21 around the accommodating hole 215, in which one of the protruding blocks 216 is connected to the two positioning portions 211. The two protruding blocks 216 are disposed symmetrically for ease of clamping the chip module 1. The fixing structure further includes a bonding adhesive disposed between the fixing member 21 and the chip module 1, and the bonding adhesive bonds the fixing member 21 to the chip module 1.

Figure 3:
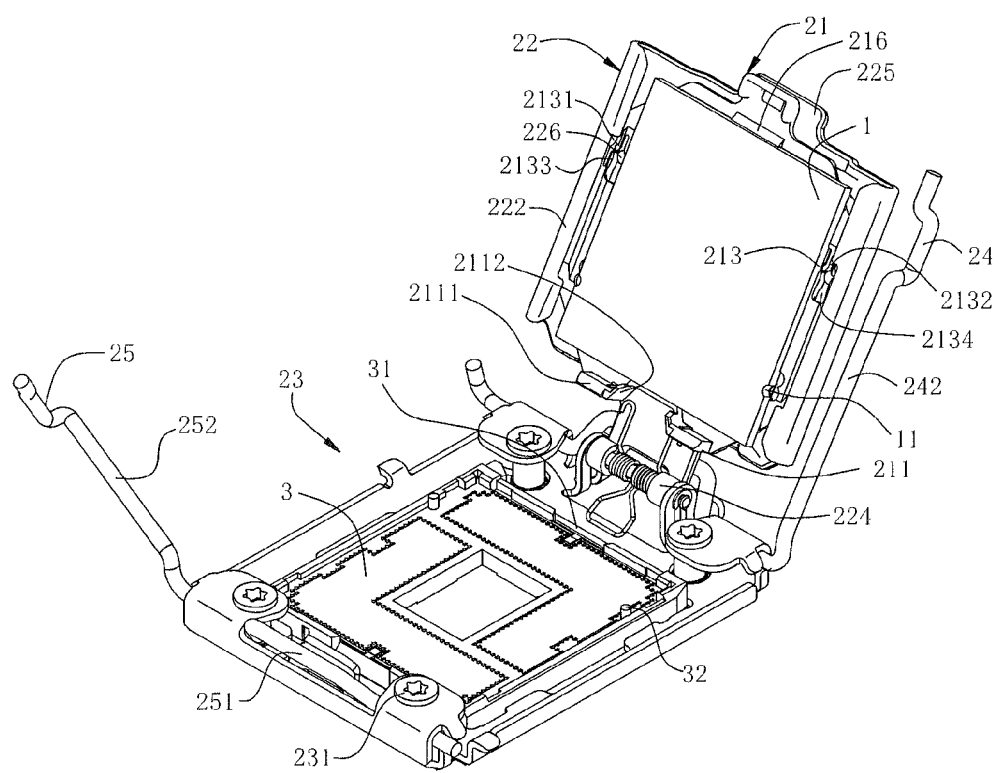
FIG. 3 is a schematic three-dimensional assembled view of the electrical connection device according to one embodiment of the present invention and the chip module when the reinforce device is not closed.
Figure 4:
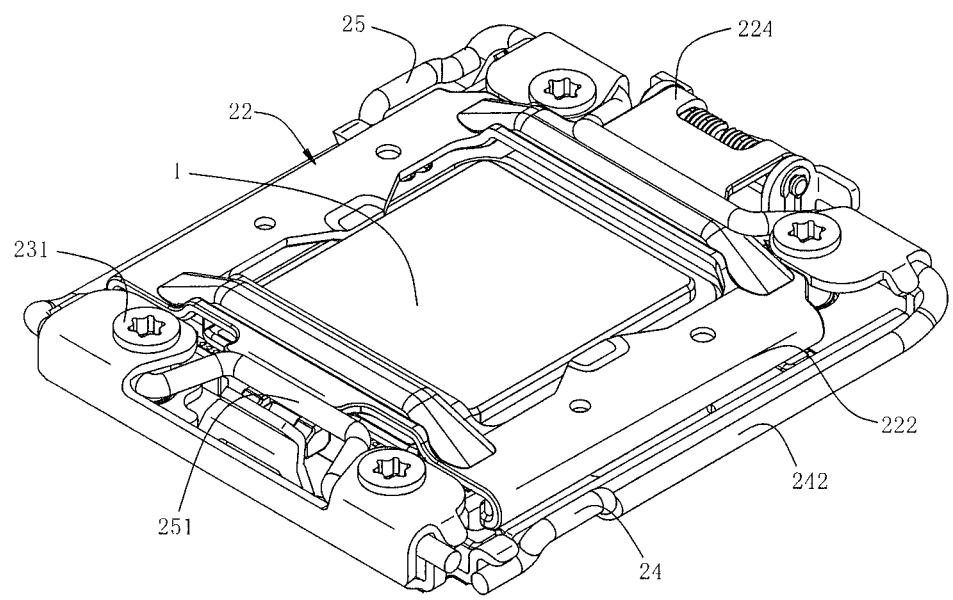
FIG. 4 is a schematic three-dimensional assembled view of the electrical connection device according to one embodiment of the present invention and the chip module when the reinforce device is closed.

Referring to FIGS. 1-3, the socket 3 is located below the chip module 1, and directly contacts the fixing member 21. The socket 3 is disposed with a groove 31 respectively at positions corresponding to the two chamfers 2112, and the groove 31 cooperates with the chamfer 2112. The socket 3 is disposed with two positioning posts 32 at positions corresponding to the two positioning slots 214. The two positioning posts 32 cooperate with the two positioning slots 214 to fix the fixing member 21 and the socket 3.

Referring to FIG. 2 and FIG. 5, in this embodiment, the socket 3 is soldered to the circuit board (not shown), the stiffener 23, the load plate 22 and the pressing member 25 are assembled, and when the fixing member 21 (the chip module 1 is first fixed to the fixing member 21 in advance) is mounted to the load plate 22, one end disposed with the positioning portion 211 is placed downward, and an edge of the fixing member 21 is disposed in the receiving slot 223, so as to preliminarily position the fixing member 21 and the load plate 22. In other embodiments, the fixing member 21 and the load plate 22 may be mounted first, followed by assembling the load plate 22 to the stiffener 23 and the pressing member 25. Then, the fixing member 21 is pushed to move toward the end where the load plate 22 is pivoted to the stiffener 23. At this time, the protrusion 226 and the bump 227 slide in the sliding slot 212. When sliding to the tail end of the sliding slot 212, the protrusion 226 enters the two second elastic arms 2133 of the restricting slot 213, and when the protrusion 226 urges against the first notch 2132, mounting of the fixing member 21 is completed.

Figure 6:
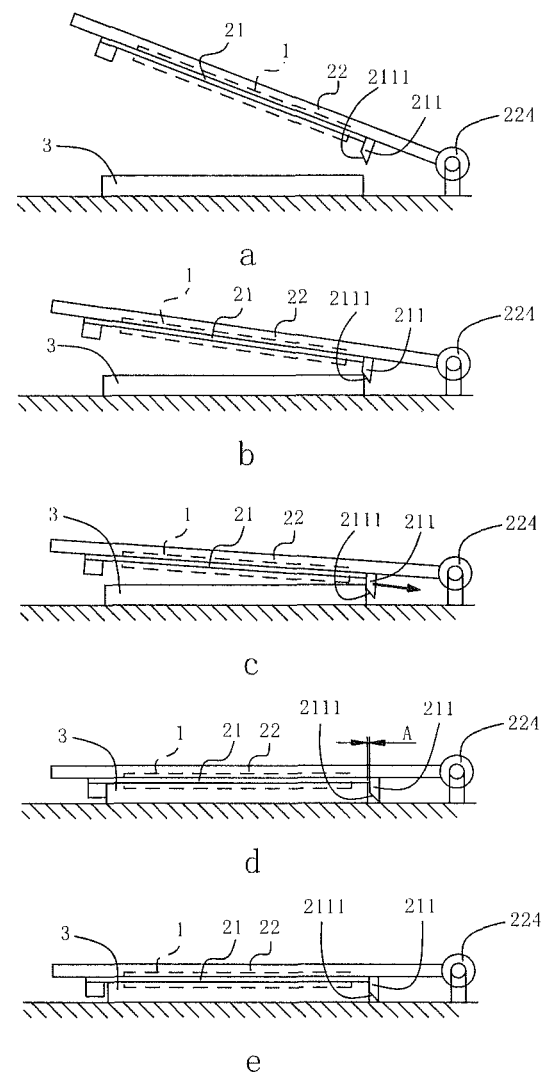
FIG. 6 is a schematic view of movement of the electrical connection device according to one embodiment of the present invention and the chip module during closing of the reinforce device.

FIGS. 1, 5 and 6 are schematic views of movement when the load plate 22 is closed on the stiffener 23 according to embodiments of the present invention. Referring to FIG. 6, as the load plate 22 rotates, the guide surface 2111 first contacts an edge of the socket 3 adjacent to the end where the load plate 22 is pivoted to the stiffener 23. As the load plate 22 continues rotating, the positioning portion 211 contacts the socket 3, and at this time, the positioning portion 211 pulls the fixing member 21 to move toward the end where the load plate 22 is pivoted to the stiffener 23, and the protrusion 226 is pressed to the first notch 2132, so that when the load plate 22 is just closed on the stiffener 23, a clearance A is formed between the positioning portion 211 and the socket 3. In this process, the two positioning posts 32 contact and cooperate with the two positioning slots 214 to fix the socket 3 and the fixing member 21 together. Finally, as the two first elastic arms 2131 are elastic, after the load plate 22 is closed on the stiffener 23, the protrusion 226 returns back into the second notch 2134, and then the pressing member 25 is fastened, so that the chip module 1 accurately and stably contacts the socket 3. Thus, the assembly of the whole electrical connection device is completed.

In other embodiments, the positioning portion 211 is disposed on the fixing member 21 away from the end where the load plate 22 is pivoted to the stiffener 23, the protrusion 226 is disposed at one side adjacent to the pivoting portion 224, and the bump 227 is disposed at one side adjacent to the pressed portion 225. In the process of closing the load plate 22 on the stiffener 23, when the chip module 1 is about to contact the socket 3, a bottom surface of the positioning portion 211 is lower than a bottom surface of the fixing member 21, so that the positioning portion 211 first contacts an edge of the socket 3 away from the end where the load plate 22 is pivoted to the stiffener 23. Then, the two positioning posts 32 contact and cooperate with the two positioning slots 214 to fix the socket 3 and the fixing member 21 together. Finally, the pressing member 25 is fastened, so that the chip module 1 accurately and stably contacts the socket 3. Thus, the assembly of the whole electrical connection device is completed.

Based on the above description, the electrical connection device according to embodiments of the present invention, among other things, has the following beneficial effects.

1. The positioning portion 211 is disposed on the fixing member 21, and in the process of closing the load plate 22 on the stiffener 23, the positioning portion 211 first contacts the socket 3, so that the positioning portion 211 guides the fixing member 21. When the fixing member 21 and the load plate 22 are not fixed in place, or the fixing member 21 slides relative to the load plate 22 in the process of closing the load plate 22 on the stiffener 23, the chip module 1 may be deviated relative to the socket 3, causing that the chip module 1 cannot be accurately positioned and signals cannot be normally transmitted. After the positioning portion 211 is added, the positioning portion 211 may be used to guide the fixing member 21 to a predetermined position, and as the positioning portion 211 first contacts the socket 3, movement of the fixing member 21 along the mounting direction of the fixing member 21 is restricted, thereby ensuring that the chip module 1 can be accurately aligned with the socket 3.

2. As the left and right sides of the fixing member 21 are respectively disposed with the restricting slot 213, the two first elastic arms 2131 are disposed at the end of the restricting slot 213 away from the end where the load plate 22 is pivoted to the stiffener 23, the tail ends of the two first elastic arms 2131 are bent outward to form the first notch 2132 larger than the space between the two first elastic arms 2131, and the width of the first notch 2132 needs to be smaller than the diameter of the protrusion 226, the fixing member 21 is prevented from being excessively pulled when the positioning portion 211 contacts the socket 3, and as the two first elastic arms 2131 are elastic, the fixing member 21 can still return to the predetermined position after being excessively pulled, thereby ensuring accurate positioning of the chip module 1.

3. As the positioning slot 214 is disposed on the fixing member 21, and the two positioning posts 32 are disposed on the socket 3 corresponding to the positioning slot 214, the two positioning posts 32 cooperate with the two positioning slots 214 to fix the fixing member 21 and the socket 3, thereby further ensuring that the chip module 1 can be accurately press-fit above the socket 3.

4. When the fixing member 21 is assembled to the load plate 22, as the receiving slot 223 is disposed on the load plate 22, the fixing member 21 and the load plate 22 can be preliminarily positioned by simply disposing edges of two sides of the fixing member 21 in the receiving slot 223, thereby facilitating installation and removal of the fixing member 21.

5. As the bonding adhesive is further disposed between the fixing member and the chip module 1, the chip module 1 can be fixed to the fixing member more firmly, thereby achieving reliable positioning.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connection device, for electrically connecting a chip module, comprising:
   (a) a reinforce device, comprising a load plate, a stiffener, a fixing member and a pressing member, wherein the fixing member is disposed on the load plate and used for fixing the chip module, at least one positioning portion is disposed on the fixing member, the load plate is pivoted to the stiffener, and the pressing member is disposed on the stiffener and used for pressing the load plate to be closed on the stiffener; and
   (b) a socket, located below the chip module, and electrically conducted to the chip module, wherein at least one groove is disposed on the socket, the positioning portion has at least one chamfer extending laterally from the positioning portion and cooperates with the groove for positioning.

2. The electrical connection device according to claim 1, wherein the positioning portion is disposed on the fixing member adjacent to an end where the load plate is pivoted to the stiffener.

3. The electrical connection device according to claim 1, wherein the positioning portion is disposed on the fixing member away from an end where the load plate is pivoted to the stiffener, and when the chip module is about to contact the socket, a bottom surface of the positioning portion is lower than a bottom surface of the fixing member.

4. The electrical connection device according to claim 1, wherein a guide surface is disposed at an edge of the positioning portion to guide the positioning portion to be fastened to the socket.

5. The electrical connection device according to claim 1, wherein the fixing member has two positioning portions, and the two positioning portions are disposed symmetrically.

6. The electrical connection device according to claim 1, wherein at least one restricting slot is disposed on the fixing member, at least one protrusion is disposed on the load plate, and the protrusion and the restricting slot cooperate for fixing.

7. The electrical connection device according to claim 6, wherein two first elastic arms are disposed at one end of the restricting slot, and two second elastic arms are disposed at the other end of the restricting slot corresponding to the two first elastic arms, the two first elastic arms are disposed opposite to the two second elastic arms, a minimum space between the two first elastic arms is smaller than a minimum space between the two second elastic arms, the protrusion is located in the two second elastic arms, and the two first elastic arms are used for limiting displacement of the protrusion toward the first elastic arm.

8. The electrical connection device according to claim 6, wherein at least one sliding slot is disposed on a bottom surface of the fixing member, so that the protrusion slides in the sliding slot.

9. The electrical connection device according to claim 1, wherein at least one positioning post is disposed on the socket, a positioning slot is disposed on the fixing member corresponding to the positioning post, and the positioning post cooperates with the positioning slot to fix the fixing member and the socket.

* * * * *